US012748150B2

(12) United States Patent
Sugimori et al.

(10) Patent No.: US 12,748,150 B2
(45) Date of Patent: Sep. 29, 2026

(54) POWER STORAGE CONTROL APPARATUS, POWER STORAGE APPARATUS, REMAINING CHARGE TIME COMPUTING METHOD, AND NON-TRANSITORY COMPUTER-READABLE STORAGE MEDIUM STORING REMAINING CHARGE TIME COMPUTING PROGRAM

(71) Applicant: FDK CORPORATION, Tokyo (JP)

(72) Inventors: Shunichiro Sugimori, Tokyo (JP); Katsuhiko Tamaki, Tokyo (JP)

(73) Assignee: FDK CORPORATION, Tokyo (JP)

( * ) Notice: Subject to any disclaimer, the term of this patent is extended or adjusted under 35 U.S.C. 154(b) by 718 days.

(21) Appl. No.: 18/201,216

(22) Filed: May 24, 2023

(65) Prior Publication Data

US 2023/0393201 A1 Dec. 7, 2023

(30) Foreign Application Priority Data

Jun. 3, 2022 (JP) ................................ 2022-090892

(51) Int. Cl.
*G01R 31/367* (2019.01)
*G01R 31/36* (2020.01)
(Continued)

(52) U.S. Cl.
CPC ......... *G01R 31/367* (2019.01); *G01R 31/374* (2019.01); *H02J 7/80* (2026.01); *G01R 31/3648* (2013.01); *H02J 7/865* (2026.01)

(58) Field of Classification Search
CPC ................ G01R 31/367; G01R 31/374; G01R 31/3648; H02J 7/80; H02J 7/865
See application file for complete search history.

(56) References Cited

U.S. PATENT DOCUMENTS

2015/0249355 A1* 9/2015 Takano .................. B60L 58/12 320/150
2016/0209474 A1 7/2016 Chiu et al.
(Continued)

FOREIGN PATENT DOCUMENTS

CN 105974321 A * 9/2016 ......... G01R 31/3648
CN 112216886 A * 1/2021 .......... H01M 10/443
(Continued)

OTHER PUBLICATIONS

Machine translation for CN-110146816-B, downloaded Feb. 2026 (Year: 2026).*
(Continued)

*Primary Examiner* — John C Kuan
(74) *Attorney, Agent, or Firm* — Amin, Turocy & Watson, LLP

(57) ABSTRACT

A power storage control apparatus includes a processor that computes a remaining charge time of a power storage apparatus that supplies power to a load apparatus operating by power supply from an external power source in case of a power supply emergency of the external power source, and the processor computes the remaining charge time of the power storage apparatus based on linear approximation of correlation between an operating environment of the power storage apparatus and a charge time of the power storage apparatus including a charge stop time.

8 Claims, 6 Drawing Sheets

(51) Int. Cl.

| | |
|---|---|
| ***G01R 31/374*** | (2019.01) |
| ***H02J 7/80*** | (2026.01) |
| *H02J 7/00* | (2006.01) |

(56) References Cited

U.S. PATENT DOCUMENTS

| | | | | |
|---|---|---|---|---|
| 2017/0063150 | A1 | 3/2017 | Sakamoto et al. | |
| 2021/0349157 | A1 | 11/2021 | Srinivasan et al. | |
| 2022/0308114 | A1 * | 9/2022 | Sun ...................... | G01R 31/382 |

FOREIGN PATENT DOCUMENTS

| | | | | | |
|---|---|---|---|---|---|
| CN | 112230147 | A | * | 1/2021 | ........... G01R 31/367 |
| CN | 112834931 | A | * | 5/2021 | ........... G01R 31/382 |
| CN | 110146816 | B | * | 2/2022 | ........... G01R 31/387 |
| EP | 2899841 | | | 7/2015 | |
| JP | 09-322420 | | | 12/1997 | |
| JP | 2000-323182 | | | 11/2000 | |
| JP | 2006-238598 | | | 9/2006 | |
| JP | 2016-010250 | | | 1/2016 | |
| WO | WO-9405068 | A1 | * | 3/1994 | ............ H01M 10/48 |

OTHER PUBLICATIONS

Machine translation for CN-112230147-A, downloaded Feb. 2026 (Year: 2026).*

Bi et al., "Predicting Charging Time of Battery Electric Vehicles Based on Regression and Time-Series Methods: a Case Study of Beijing" Energies 2018, 11, 1040 (Year: 2018).*

Extended European Search Report for European Patent Application No. 23176263.4 dated Nov. 3, 2023.

* cited by examiner

T

| BATTERY TEMPERATURE | FULL CHARGE TIME (FTR) | INPUT VOLTAGE (VR) |
|---|---|---|
| Lower than 0°C | A0 | B0 |
| 0°C or higher and lower than 10°C | A1 | B1 |
| 10°C or higher and lower than 20°C | A2 | B2 |
| 20°C or higher and lower than 30°C | A3 | B3 |
| 30°C or higher and lower than 40°C | A4 | B4 |
| 40°C or higher | A5 | B5 |

FIG. 3

POWER STORAGE CONTROL APPARATUS, POWER STORAGE APPARATUS, REMAINING CHARGE TIME COMPUTING METHOD, AND NON-TRANSITORY COMPUTER-READABLE STORAGE MEDIUM STORING REMAINING CHARGE TIME COMPUTING PROGRAM

CROSS REFERENCE TO RELATED APPLICATIONS

This application is entitled to or claims the benefit of Japanese Patent Application No. 2022-090892, filed on Jun. 3, 2022, the disclosure of which including the specification, drawings and abstract is incorporated herein by reference in its entirety.

TECHNICAL FIELD

The present disclosure relates to a power storage control apparatus, a power storage apparatus, a remaining charge time computing method, and a non-transitory computer-readable storage medium storing a remaining charge time computing program.

BACKGROUND ART

When an external power supply is in a power supply emergency (e.g., power outage), a conventionally known power storage apparatus (also referred to as a "battery bank unit") discharges and supplies power in place of the external power source to a load apparatus that operates by power supply from the external power source (see, for example, Patent Literature (hereinafter, referred to as PTL) 1). In general, a power storage apparatus includes a plurality of power storage devices (also referred to as "battery banks" or "battery packs"), and the plurality of power storage devices are each composed of a plurality of secondary batteries that can be charged by power supply from an external power source in normal times, and are connected in parallel to each other.

Each of the plurality of power storage devices can be controlled to discharge or not by turning on or off an output switch provided correspondingly. A corresponding output switch is turned off so that one of the power storage devices is disabled for charging, and at the same time, another corresponding output switch is turned on so that another storage device can discharge and supply power. Such a charging method is sometimes referred to as a "bank switch method". The bank switch method enables continuous power supply to a load apparatus when necessary and prevents unnecessary power supply to the load apparatus when not needed.

For the load apparatus management, for example, there is a need to know the time required for the charge of a power storage apparatus, especially the remaining time for the charge (remaining charge time) during the charge.

PTL 2, for example, describes a remaining charge time computing method for estimating the remaining charge time. In the conventional remaining charge time computing method described in PTL 2, an estimate value of the remaining charge time is computed from the state of charge (SOC), which is obtained by integrating the charging current, and the charging current during the charge.

CITATION LIST

Patent Literature

PTL 1
Japanese Patent Application Laid-Open No. 2016-10250
PTL 2
Japanese Patent Application Laid-Open No. H09-322420

SUMMARY OF INVENTION

Technical Problem

In some cases, a power storage apparatus has a charge stop time in which the charge to internal power storage devices is temporarily stopped. In a power storage apparatus employing the above-described bank switch method, for example, there may be a period in which none of the power storage devices are charged temporarily between completion of the charge to one of the power storage devices and start of the charge to another power storage device.

The conventional remaining charge time computing method described above does not assume a case with the charge stop time. Thus, the accuracy of remaining charge time estimation only improves to a certain degree.

The objective of the present disclosure is to provide a power storage control apparatus, a power storage apparatus, a remaining charge time computing method, and a non-transitory computer-readable storage medium storing a remaining charge time computing program, each capable of improving the accuracy of remaining charge time estimation.

Solution to Problem

An aspect of a power storage control apparatus according to the present disclosure includes: a processor that computes a remaining charge time of a power storage apparatus based on linear approximation of correlation between an operating environment of the power storage apparatus and a charge time of the power storage apparatus, the charge time including a charge stop time.

An aspect of a power storage apparatus according to the present disclosure is a power storage apparatus that supplies power to a load apparatus in case of a power supply emergency of an external power source, the load apparatus operating by power supply from the external power source, wherein the power storage apparatus includes the above power storage control apparatus.

An aspect of a remaining charge time computing method according to the present disclosure includes: computing, by a processor, a remaining charge time of a power storage apparatus based on linear approximation of correlation between an operating environment of the power storage apparatus and a charge time of the power storage apparatus, the charge time including a charge stop time.

An aspect of a non-transitory computer-readable storage medium according to the present disclosure stores a remaining charge time computing program for causing a computer to implement the above remaining charge time computing method.

Advantageous Effects of Invention

According to the present disclosure, it is possible to improve the accuracy of remaining charge time estimation.

BRIEF DESCRIPTION OF DRAWINGS

FIG. 3 illustrates an exemplary table stored in storage illustrated in FIG. 2;

DESCRIPTION OF EMBODIMENT

Hereinafter, a battery bank unit (BBU) according to an embodiment of the present disclosure will be described with reference to the accompanying drawings.

Figure 1:
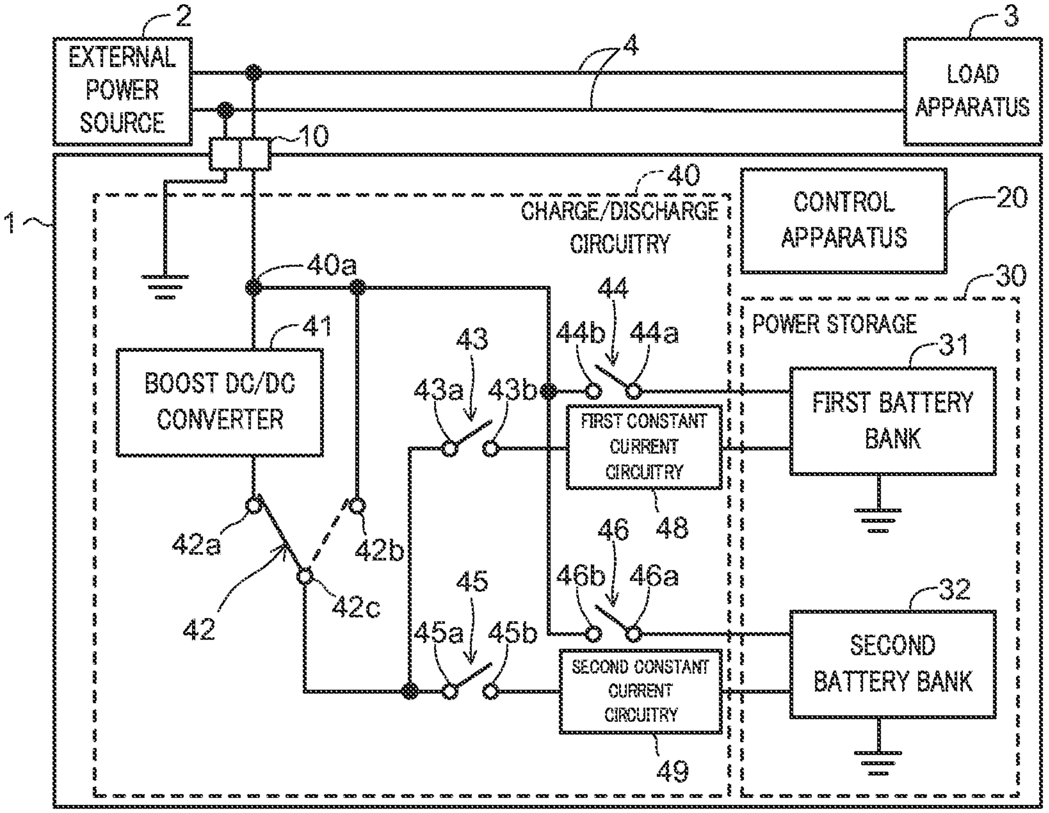
FIG. 1 schematically illustrates a configuration of a battery bank unit according to an embodiment of the present disclosure.

FIG. 1 is a schematic diagram of BBU 1 according to the present embodiment. BBU 1 supplies power to load apparatus 3 connected to external power source 2 when external power source 2 has lost power. BBU 1 is charged by the power of external power source 2.

External power source 2 is, for example, an apparatus that converts commercial AC power into DC power and outputs the DC power. Load apparatus 3 is an apparatus (e.g., server apparatus) that operates with DC power.

BBU 1 includes input/output terminal 10, control apparatus 20, power storage 30, and charge/discharge circuitry 40. BBU 1 is an example of a power storage apparatus. Input/output terminal 10 is connected to power lines 4 that supply power to load apparatus 3 from external power source 2. The connection between input/output terminal and power lines 4 enables BBU 1 to supply power to load apparatus 3 in case of a power supply emergency (mainly power outage) of external power source 2.

Power storage 30 includes first battery bank (BB) 31 and second BB 32. First BB 31 and second BB 32 are both examples of a power storage device and have similar configurations to each other. First BB 31 and second BB 32 are each composed of a plurality of secondary batteries connected in series, for example. The type of the secondary batteries is a nickel-hydrogen secondary battery in the present embodiment. Note that the secondary battery is not necessarily a nickel-hydrogen secondary battery, and may be another secondary battery such as a lithium-ion secondary battery. First BB 31 and second BB 32 are connected in parallel to each other.

Charge/discharge circuitry 40 functions as circuitry that performs charge and discharge of first BB 31 and second BB 32 via input/output terminal 10. Charge/discharge circuitry 40 includes boost DC/DC converter 41, switch 42, first charge switch 43, first discharge switch 44, second charge switch 45, second discharge switch 46, first constant current circuitry 48, and second constant current circuitry 49. Charge/discharge circuitry charges first BB 31 and second BB 32 sequentially (or alternately) in charge processing to be described later. That is, BBU 1 uses the bank switch method as the charge method.

Boost DC/DC converter 41 is a power conversion apparatus that boosts power supplied from external power source 2 and outputs the boosted power.

Switch 42 switches a value of voltage applied to first BB 31 and second BB 32. In switch 42, first terminal 42*a* is connected to an output terminal of boost DC/DC converter 41, and second terminal 42*b* is connected to input/output terminal 10. Additionally, third terminal 42*c* is connected to first BB 31 via first charge switch 43 and first constant current circuitry 48, and is connected to second BB 32 via second charge switch 45 and second constant current circuitry 49.

When switch 42 is in the on state, first terminal 42*a* and third terminal 42*c* are connected to each other. In this case, the power outputted from external power source 2 is outputted via boost DC/DC converter 41. That is, the power outputted from boost DC/DC converter 41 is supplied to first BB 31 and second BB 32 via first charge switch 43 and second charge switch 45. In contrast, when switch 42 is in the off state, second terminal 42*b* and third terminal 42*c* are connected to each other, and the power outputted from external power source 2 is supplied to first BB 31 and second BB 32 via first charge switch 43 and second charge switch 45 without through boost DC/DC converter 41.

First charge switch 43 allows first BB 31 to be charged when in the on state, and does not allow first BB 31 to be charged when in the off state. In first charge switch 43, first terminal 43*a* is connected to third terminal 42*c* of switch 42 and second terminal 43*b* is connected to the positive electrode of first BB 31. Note that the negative electrode of first BB 31 is connected to the ground.

First discharge switch 44 allows first BB 31 to discharge when in the on state, and does not allow first BB 31 to discharge when in the off state. In first discharge switch 44, first terminal 44*a* is connected to the positive electrode of first BB 31, and second terminal 44*b* is connected to input/output terminal 10.

Second charge switch 45 allows second BB 32 to be charged when in the on state, and does not allow second BB 32 to be charged when in the off state. In second charge switch 45, first terminal 45*a* is connected to third terminal 42*c* of switch 42 and second terminal 45*b* is connected to the positive electrode of second BB 32. Note that the negative electrode of second BB 32 is connected to the ground.

Second discharge switch 46 allows second BB 32 to discharge when in the on state, and does not allow second BB 32 to discharge when in the off state. In second discharge switch 46, first terminal 46*a* is connected to the positive electrode of second BB 32, and second terminal 46*b* is connected to input/output terminal 10.

Figure 2:
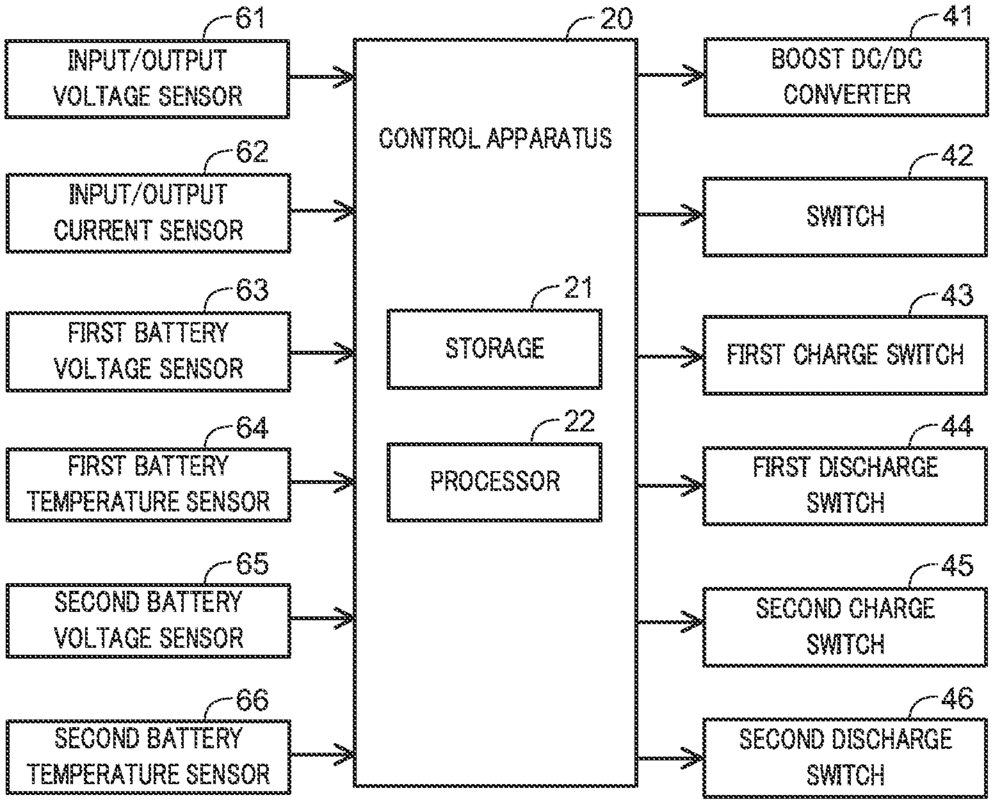
FIG. 2 is a block diagram illustrating a configuration of a control apparatus illustrated in FIG. 1.

FIG. 2 is a block diagram of BBU 1. As illustrated in FIG. 2, BBU 1 further includes input/output voltage sensor 61, input/output current sensor 62, first battery voltage sensor 63, first battery temperature sensor 64, second battery voltage sensor 65, and second battery temperature sensor 66.

Input/output voltage sensor 61 detects a value of voltage inputted to BBU 1 from external power source 2 via input/output terminal 10 or outputted to load apparatus 3 from BBU 1 via input/output terminal 10. To be more specific, input/output voltage sensor 61 detects a value of voltage between input/output terminal 10 and connecting point 40*a* of charge/discharge circuitry 40. Power outage of external power source 2 can be detected based on the value of input voltage (power source voltage value) to BBU 1 from external power source 2 detected by input/output voltage sensor 61.

Input/output current sensor 62 detects a value of current flowing in or out of power lines 4 via input/output terminal 10. To be more specific, input/output current sensor 62 detects a value of current between input/output terminal 10 and connecting point 40*a* of charge/discharge circuitry 40.

First battery voltage sensor 63 detects a voltage value of first BB 31. First battery temperature sensor 64 detects the temperature of first BB 31.

Second battery voltage sensor 65 detects a voltage value of second BB 32. Second battery temperature sensor 66 detects the temperature of second BB 32. Input/output voltage sensor 61, input/output current sensor 62, first battery voltage sensor 63, first battery temperature sensor 64, second battery voltage sensor 65, and second battery temperature sensor 66 respectively transmit the detected values to control apparatus 20.

First constant current circuitry 48 and second constant current circuitry 49 are provided corresponding to first BB 31 and second BB 32 respectively. First constant current circuitry 48 and second constant current circuitry 49 output a constant current to corresponding first BB 31 and second BB 32 regardless of the voltage inputted from external power source 2 (through or without through boost DC/DC converter 41).

Note that first constant current circuitry 48 and second constant current circuitry 49 should be provided for secondary batteries respectively in a case of using secondary batteries that are preferably charged at a constant current, such as nickel-hydrogen secondary batteries used in the present embodiment.

Control apparatus 20 includes storage 21 and processor 22 and is realized by a computer, for example. Processor 22 is realized by a central processing unit (CPU), for example. Storage 21 includes a storage apparatus realized by a hard disk drive (HDD), for example, and a memory apparatus realized by random access memory (RAM), for example.

Processor 22 reads various control programs or instructions to implement functions of BBU 1 and data, etc. related to the programs or instructions (hereinafter simply referred to as "programs, etc.") from the storage apparatus, stores them in the memory apparatus, and executes various control programs or instructions while using the data, etc. In the present embodiment, the data, etc. includes table T and expressions to be described later.

The program, etc. may be stored in a removable storage medium such as flash memory. In this case, control apparatus 20 is configured to allow the removable storage medium to be inserted and removed, and the program, etc., is read from the storage medium. Note that control apparatus 20 may be configured to be able to perform external communication, so that the programs, etc., may be downloaded to control apparatus 20 from the outside through a communication network.

The storage apparatus, memory apparatus, and removable storage medium described above are examples of a non-transitory computer-readable storage medium.

Control apparatus 20 controls the states of switches 42 to 46. Control apparatus 20 also controls the drive of boost DC/DC converter 41. The control of each component in BBU 1 by control apparatus 20 controls charge and discharge of BBU 1, thus implementing a function of BBU 1 as an uninterruptible power supply, for example. Control apparatus is an example of a power storage control apparatus that controls BBU 1, which is a power storage apparatus.

Table T is a set of data referenced by control apparatus 20 when it computes the remaining charge time. Computation of the remaining charge time is performed at the start of the charge of BBU 1. The remaining charge time is time required from the start to completion of the charge of BBU 1.

FIG. 3 illustrates an example of table T. In table T, the battery temperature, the reference value of full charge time (full charge time reference value FTR), and the reference value of input voltage (input voltage reference value VR) are associated with each other for each reference value of battery temperature (temperature range in the present embodiment).

Table T is an example of correlation data that represents the correlation between the operating environment of BBU 1 and the charge time of BBU 1. The combination of full charge time reference value FTR and input voltage reference value VR is an example of battery temperature-specific data set for each battery temperature reference value of BBU 1. Note that the "operating environment" in the present embodiment includes, for example, the battery temperature at the start of charge, the input voltage at the start of charge, and the SOC at the start of charge.

In table T, the battery temperature is divided into six temperature zones in total, and between 0° C. and 40° C., which is a general operating temperature range of a nickel-hydrogen secondary battery, there are six zones each including a range of 10° C. Needless to say, the number of battery temperature zones are not limited to those illustrated in FIG. 3.

In the example illustrated in FIG. 3, for the battery temperature "lower than 0° C.", for example, "A0" is stored as full charge time reference value FTR and "B0" is stored as input voltage reference value VR. "A0", "A1", "A2", "A3", "A4", and "A5" as full charge time reference values FTR and "B0", "B1", "B2", "B3", "B4", and "B5" as input voltage reference values VR are all indicated as symbols for convenience, but they are actually numeral values and sometimes updated after completion of the charge. How to use table T (remaining charge time computing method) will be described later.

The configuration of BBU 1 according to the present embodiment has been described, thus far.

Figure 4:
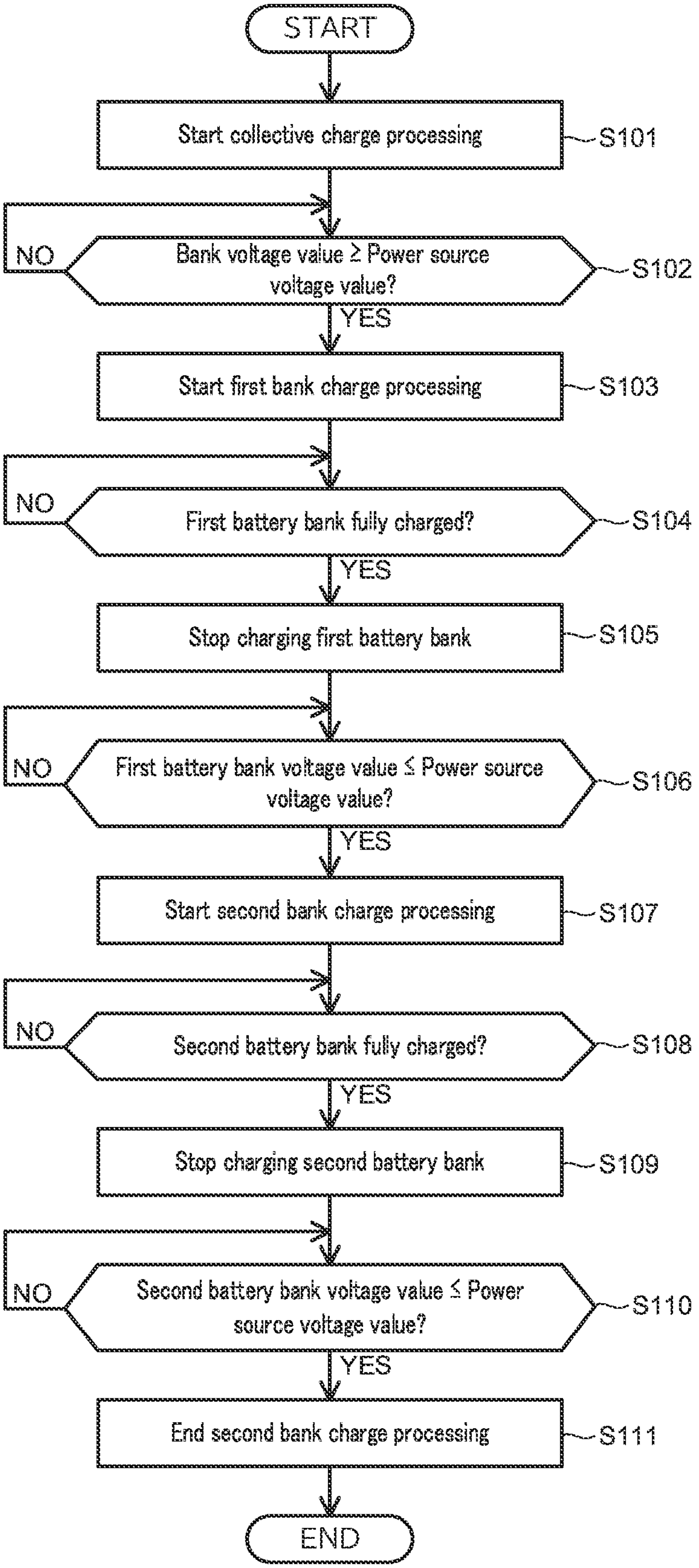
FIG. 4 is a flowchart describing charge processing of the battery bank unit according to the embodiment.

Next, exemplary processing of the charge of BBU 1 performed by control apparatus will be described with reference to the flowchart in FIG. 4 and the timing chart in FIG. 5.

Figure 5:
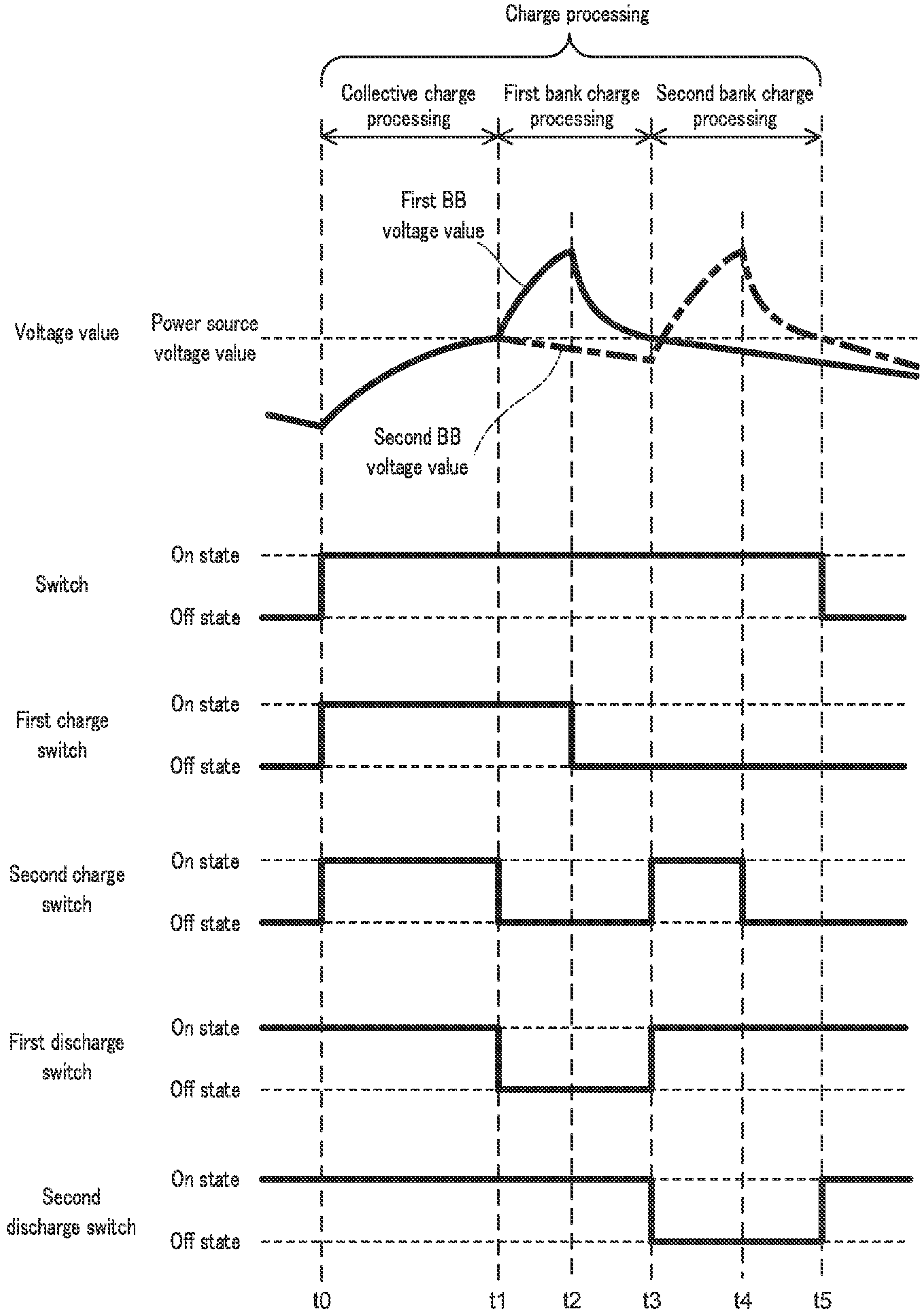
FIG. 5 is a timing chart describing the charge processing of the battery bank unit according to the embodiment.

In the graph illustrated in the upper section of FIG. 5, the solid-line voltage value indicates the voltage value of first BB 31, and the chain-line voltage value indicates the voltage value of second BB 32. In this example, the voltage values of first BB 31 and second BB 32 are substantially equal before the start of collective charge processing and during the collective charge processing. That is, the lines indicating the voltage values of first BB 31 and second BB 32 overlap each other, resulting in the solid line. The "power source voltage value" illustrated in FIG. 5 is a value of voltage inputted to load apparatus 3 and BBU 1 from external power source 2 in normal times. In this regard, the power source voltage value in the following description is the power source voltage value in normal times unless otherwise noted. Needless to say, the actual power source voltage value of external power source 2 in an emergency such as power outage is remarkably lower than the power source voltage value in normal times.

Before the start of charge processing, switch 42, first charge switch 43, and second charge switch 45 are all in the off state, and first discharge switch 44 and second discharge switch 46 are both in the on state. This allows the discharge of first BB 31 and second BB 32. In this example, the voltage values and charge amounts of first BB 31 and second BB 32 are substantially equal before the start of charge processing. Accordingly, the SOC of BBU 1, which is the average of the SOCs of first BB 31 and second BB 32, is substantially equal to each of the SOCs of first BB 31 and second BB 32. Note that the SOCs of first BB 31 and second BB 32 can be computed, for example, from measurement values of their battery voltages.

Control apparatus 20 starts the charge processing when detecting the connection to external power source 2 or the end of power outage of external power source 2 based on the detected value of input/output voltage sensor 61. Control apparatus 20 may start the charge processing when the SOC of BBU 1 has decreased to a predetermined value or lower.

Control apparatus 20 starts the collective charge processing in step S101. The collective charge processing is processing of charging first BB 31 and second BB 32 collectively. To be more specific, as illustrated in FIG. 5, control apparatus 20 switches switch 42, first charge switch 43, and second charge switch 45 to the on state (time t0) from the state where switch 42, first charge switch 43, and second charge switch 45 are all in the off state and first discharge switch 44 and second discharge switch 46 are both in the on state.

First discharge switch 44 and second discharge switch 46 remain the on state. This allows BBU 1 to discharge and supply power to load apparatus 3 when the battery voltage value of at least one of first BB 31 and second BB 32 is above the power source voltage value of external power source 2 (at the time of power outage) even in a situation where external power source 2 loses power during the collective charge processing.

When the collective charge processing is started (time t0), power is supplied from boost DC/DC converter 41 to first BB 31 and second BB 32, and the voltage values of first BB 31 and second BB 32 increase.

Next, in step S102, control apparatus 20 determines whether the bank voltage value, which is the voltage value of BBU 1, is equal to or higher than the power source voltage value. The bank voltage value is specifically a mean value of the voltage value of first BB 31 and the voltage value of second BB 32. Note that the bank voltage value may be either one of the voltage values of first BB 31 and second BB 32. When the bank voltage value is lower than the power source voltage value (NO in S102), the collective charge processing is continued.

Meanwhile, when the voltage values of first BB 31 and second BB 32 increase and the bank voltage value becomes equal to or higher than the power source voltage value (time t1; YES in S102), control apparatus 20 ends the collective charge processing and starts first bank charge processing in step S103.

The first bank charge processing is processing of charging only first BB 31. First BB 31 is fully charged in the first bank charge processing. The battery voltage value when fully charged is sufficiently higher than the power source voltage value. Second BB 32 is not charged in the first bank charge processing.

To be more specific, control apparatus 20 switches second charge switch 45 to the off state and first discharge switch 44 to the off state (time t1). As a result, the power of boost DC/DC converter 41 is supplied only to first BB 31, and the voltage value of first BB 31 further increases from the power source voltage value. In the first bank charge processing, first discharge switch 44 is in the off state and first BB 31 does not discharge. This makes it possible to prevent application of the voltage higher than the power source voltage value to load apparatus 3, thereby preventing failure of load apparatus 3, for example.

Meanwhile, the charge of second BB 32 is stopped, and the voltage value of second BB 32 gradually decreases due to self-discharge. Second discharge switch 46 is in the on state in the first bank charge processing. Thus, when external power source 2 loses power during the first bank charge processing and the power source voltage value remarkably decreases from the power source voltage value in normal times, second BB 32 starts discharging and BBU 1 supplies power to load apparatus 3.

Subsequently, control apparatus 20 determines whether first BB 31 is fully charged in step S104. To be more specific, control apparatus 20 determines whether the detected value of first battery temperature sensor 64 has reached a predetermined first temperature. The first temperature is a temperature at which first BB 31 is fully charged. When the detected value of first battery temperature sensor 64 is lower than the first temperature (NO in S104), control apparatus 20 continues the first bank charge processing for charging first BB 31 only.

In contrast, when first BB 31 is fully charged and the detected value of first battery temperature sensor 64 reaches the first temperature (time t2; YES in S104), control apparatus stops the first bank charge processing for charging first BB 31 only in step S105.

To be more specific, control apparatus 20 switches first charge switch 43 to the off state (time t2). As a result, the charge of first BB 31 is stopped, and the voltage value of first BB 31 gradually decreases due to self-discharge. At this time, the temperature of first BB 31 is higher than the temperature of second BB 32. Thus, the drop amount of the voltage value of first BB 31 per unit time is larger than the drop amount of the voltage value of second BB 32 per unit time.

Next, in step S106, control apparatus 20 determines whether the voltage value of first BB 31 is equal to or lower than the power source voltage value. When the voltage value of first BB 31 is higher than the power source voltage value (NO in S106), control apparatus 20 continues the state where first BB 31 and second BB 32 are not charged. This period (from time t2 to time t3) is the charge stop time.

When the voltage value of first BB 31 is equal to or lower than the power source voltage value (time t3; YES in S106), in contrast, control apparatus 20 ends the first bank charge processing and starts second bank charge processing in step S107.

The second bank charge processing is processing of charging only second BB 32. Second BB 32 is fully charged in the second bank charge processing. First BB 31 is not charged in the second bank charge processing.

To be more specific, control apparatus 20 switches second charge switch 45 to the on state, first discharge switch 44 to the on state, and second discharge switch 46 to the off state (time t3). As a result, power is supplied from boost DC/DC converter 41 to second BB 32 only, and the voltage value of second BB 32 increases and exceeds the power source voltage value. In the second bank charge processing, second discharge switch 46 is in the off state and second BB 32 does not discharge. This makes it possible to prevent application of a voltage value higher than the power source voltage value to load apparatus 3, thereby preventing failure of load apparatus 3, for example.

Meanwhile, the charge of first BB 31 remains stopped, and the voltage value of first BB 31 gradually decreases due to self-discharge. First discharge switch 44 is in the on state in the second bank charge processing. Thus, when external power source 2 loses power during the second bank charge processing and the power source voltage value remarkably decreases from the power source voltage value in normal times, first BB 31 starts discharging and BBU 1 supplies power to load apparatus 3.

Then, control apparatus 20 determines whether second BB 32 is fully charged in step S108. To be more specific, control apparatus 20 determines whether the detected value of second battery temperature sensor 66 has reached a predetermined second temperature. The second temperature is the temperature at which second BB 32 is fully charged. The second temperature may be the same as the first temperature. When the detected value of second battery temperature sensor 66 is lower than the second temperature (NO in S108), control apparatus 20 continues the second bank charge processing for charging second BB 32 only.

In contrast, when second BB 32 is fully charged and the detected value of second battery temperature sensor 66 reaches the second temperature (time t4; YES in S108), control apparatus 20 stops the second bank charge processing for charging second BB 32 only in step S109.

To be more specific, control apparatus 20 switches second charge switch 45 to the off state (time t4). Accordingly, the charge of second BB 32 is stopped, and the voltage value of second BB 32 gradually decreases due to self-discharge. At this time, the temperature of second BB 32 is higher than the temperature of first BB 31. Thus, the drop amount of the voltage value of second BB 32 per unit time is larger than the drop amount of the voltage value of first BB 31 per unit time.

Next, in step S110, control apparatus 20 determines whether the voltage value of second BB 32 is equal to or lower than the power source voltage value. When the voltage value of second BB 32 is higher than the power source voltage value (NO in S110), control apparatus 20 continues the state where first BB 31 and second BB 32 are not charged.

When the voltage value of second BB 32 is equal to or lower than the power source voltage value (time t5; YES in S110), in contrast, control apparatus 20 ends the second bank charge processing in step S111. To be more specific, control apparatus 20 switches switch 42 to the off state and second discharge switch 46 to the on state (time t5). This terminates the charge of BBU 1 and completes the procedure of charge processing. Control apparatus specifies the SOC of BBU 1 at the end of the charge of BBU 1 as 100%.

Note that BBU 1 may include three or more battery banks. In a case of including N battery banks, where N is an integer equal to or greater than 3, the N battery banks are collectively charged in the collective charge processing. When the collective charge processing is finished, the n-th bank charge processing, where n is an integer from 1 to N, for each of N battery banks is performed sequentially as is the case with the above first and second bank charge processing. Further, in a case of a plurality of battery banks, N battery banks may be divided into M battery bank groups, where M is an integer equal to or greater than 2, and the m-th bank charge processing, where m is an integer from 1 to M, for each of M battery bank groups may be performed sequentially. In the m-th bank charge processing, a plurality of battery banks in the same battery bank group are charged simultaneously.

Figure 6:
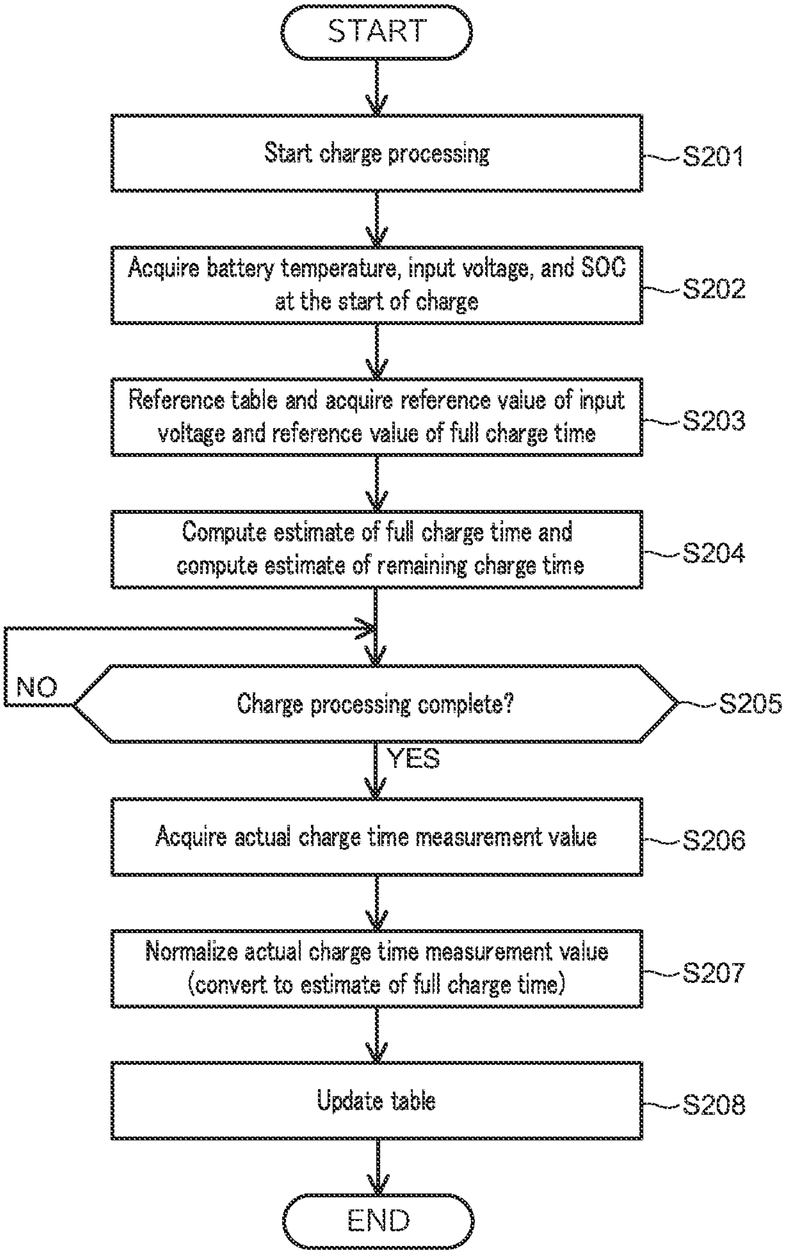
FIG. 6 is a flowchart describing a remaining charge time computing method of the battery bank unit according to the embodiment.

Next, a remaining charge time computing method for BBU 1 performed by processor 22 of control apparatus 20 will be described with reference to the flowchart in FIG. 6.

When the charge processing is started (step S201), processor 22 acquires the battery temperature, input voltage, and SOC at the start of charge processing (step S202). Conditions for starting the charge processing include the connection between BBU 1 and external power source 2, the end of power outage of external power source 2, the decrease in the SOC of BBU 1, or the like, as described above. Processor 22 computes a mean value of the detected value of first battery temperature sensor 64 and the detected value of second battery temperature sensor 66, which are acquired at the start of charge processing, as a start-of-charge battery temperature. At the start of charge processing, processor 22 also acquires the detected value of input/output voltage sensor 61 as the input voltage at the start of charge (start-of-charge input voltage VM). Further, processor 22 acquires the SOC at the start of charge (hereinafter, referred to as "start-of-charge charge state SOCS") from the detected values of first battery voltage sensor 63 and second battery voltage sensor 65, which are acquired at the start of charge processing, and a predetermined voltage value corresponding to the SOC of 100% of BBU 1.

Then, processor 22 references table T (step S203). At this time, processor 22 reads the input voltage (input voltage reference value VR) and the full charge time (full charge time reference value FTR) associated with the temperature zone of the start-of-charge battery temperature in table T.

Next, processor 22 performs estimation processing of the remaining charge time (step S204). To be more specific, processor 22 computes an estimate of the full charge time and computes an estimate of the remaining charge time.

The estimate of full charge time is computed using the following Expression 1. Expression 1 is stored in storage 21 in advance.

[1]

$$\text{Full charge time estimate FTE}=\text{Full charge time reference value FTR}-k-(\text{Start-of-charge input voltage VM}-\text{Input voltage reference value VR}) \quad \text{(Expression 1)}$$

In Expression 1, k is a constant. Specific values of Expression 1 and constant k are stored in storage 21 in advance. Constant k is an example of correlation data.

In Expression 1, full charge time estimate FTE can be determined by adjusting full charge time reference value FTR with the difference between start-of-charge input voltage VM and input voltage reference value VR multiplied by constant k.

The remaining charge time is computed using the following Expression 2.

[2]

$$\text{Remaining charge time estimate RTE}=\text{Full charge time estimate FTE}-k_{temp}\times\text{Start-of-charge charge state SOCS} \quad \text{(Expression 2)}$$

In Expression 2, $k_{temp}$ is a constant set for each of the divided temperature zones in table T. Specific values of Expression 2 and constant $k_{temp}$ are stored in storage 21 in advance. Constant $k_{temp}$ is an example of correlation data.

In Expression 2, remaining charge time estimate RTE can be determined by adjusting full charge time estimate FTE computed in Expression 1 with start-of-charge charge state SOCS multiplied by constant $k_{temp}$. "Start-of-charge charge state SOCS multiplied by constant $k_{temp}$" is the length of charge time estimated to be reduced according to start-of-charge charge state SOCS. In other words, it is the length of time estimated to be required for charging from the SOC of 0% to start-of-charge charge state SOCS.

The computed remaining charge time estimate RTE can be used as appropriate by, for example, being presented on a display (not illustrated) of load apparatus 3 or an administrator's terminal of BBU 1.

Figure 7A:
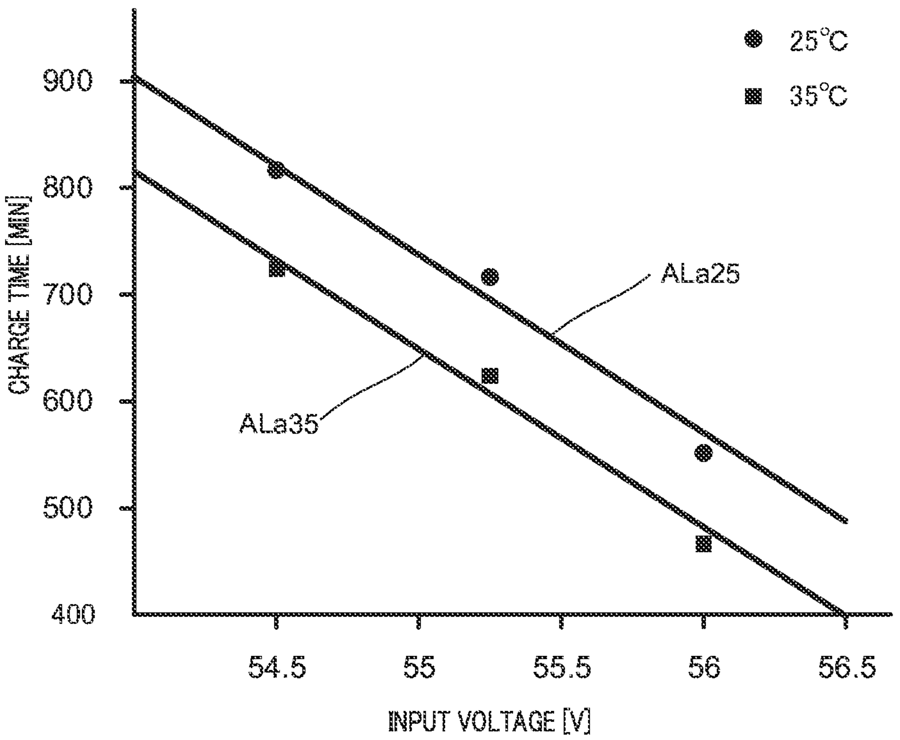
FIG. 7A illustrates the correlation between input voltage and charge time.

Here, constant k and constant $k_{temp}$ will be described with reference to FIGS. 7A and 7B. FIG. 7A illustrates the correlation between the input voltage at the start of charge and charge time, and FIG. 7B illustrates the correlation between the SOC at the start of charge and charge time.

Some data is plotted on the graph in FIG. 7A. The data is collected from an experiment, etc. conducted in advance using BBU 1 or another BBU having the same configuration as BBU 1 before BBU 1 is connected to power lines 4. The graph in FIG. 7A indicates a result of measurement in which the full charge time is measured multiple times at different input voltages (power source voltage values) and different battery temperatures. Note that it is a result of measurement with a BBU using the bank switch method; accordingly, the measured full charge time includes not only the time in which any of BBs is charged but also the charge stop time in which no BB is charged.

The graph in FIG. 7A has approximate straight lines ALa25 and ALa35, which are linear approximations of the correlation between the measurement results at the same battery temperature. Thus, it is clear that there is a correlation between the input voltage and the full charge time that can be linearly approximated. According to the result of this experiment, the slopes of these straight lines ALa25 and ALa35 (constants of the first-order approximation) have the same angle regardless of the battery temperature, as illustrated in FIG. 7A. Thus, the correlation between the input voltage and the full charge time does not depend on the battery temperature. When a new full charge time is obtained from a new input voltage, assuming that a combination of a known input voltage and the corresponding known full charge time exists, the known full charge time should be adjusted based on the difference between those two input voltages multiplied by constant k, which is independent of battery temperature. This is the reason why the above Expression 1 is used in computing full charge time estimate FTE.

Figure 7B:
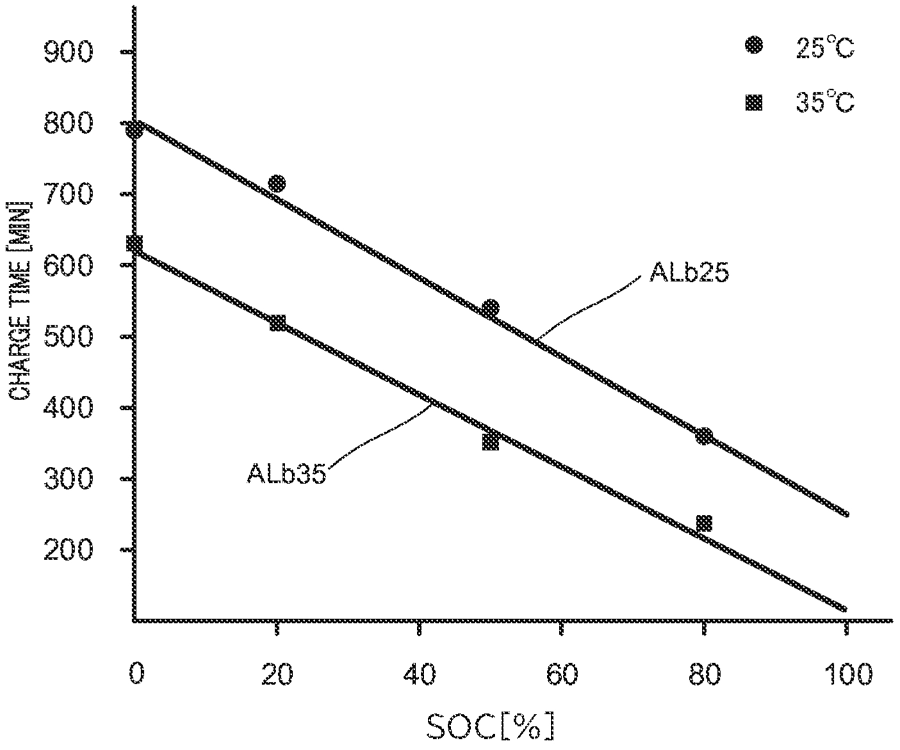
FIG. 7B illustrates the correlation between SOC and charge time.

Some data is plotted on the graph in FIG. 7B. The data is collected from an experiment, etc. conducted in advance using BBU 1 or another BBU having the same configuration as BBU 1 before BBU 1 is connected to power lines 4. The graph in FIG. 7B indicates a result of measurement in which a required charge time is measured multiple times from different start-of-charge SOCs to a full charge at different battery temperatures. Note that it is a result of measurement with a BBU using the bank switch method; accordingly, the measured required charge time includes not only the time in which any of BBs is charged but also the charge stop time in which no BB is charged.

The graph in FIG. 7B has approximate straight lines ALb25 and ALb35, which are linear approximations of the correlation between the measurement results at the same battery temperature. Thus, it is clear that there is a correlation between the start-of-charge SOC and the required charge time that can be linearly approximated. According to the result of this experiment, the slopes of these straight lines ALb25 and ALb35 (constants of the first-order approximation) have different angles from each other depending on the battery temperature, as illustrated in FIG. 7B. Thus, the correlation between the start-of-charge SOC and the required charge time depends on the battery temperature. When a new required charge time (i.e., remaining charge time) is obtained from a new start-of-charge SOC, assuming that a full charge time estimate exists for a certain battery temperature, the known full charge time estimate should be adjusted based on the new start-of-charge SOC multiplied by constant $k_{temp}$, which corresponds to the certain battery temperature. This is the reason why the above Expression 2 is used in computing remaining charge time estimate RTE.

In step S205, processor 22 stands by until the charge processing is complete (No in S205). When the charge processing is complete (Yes in S205), processor 22 acquires an actual measurement value of the charge time (actual charge time measurement value TM) (step S206). Actual charge time measurement value TM can be acquired, for example, by processor 22 measuring elapsed time from the start to completion of the charge using a timer (not illustrated) in control apparatus 20. Needless to say, this actual charge time measurement value TM includes the charge stop time in a case where the charge is stopped during the charge processing.

Processor 22 normalizes the acquired actual charge time measurement value TM (step S207). To be more specific, processor 22 converts actual charge time measurement value TM and acquires an estimate of full charge time (full charge time conversion value FTC).

Full charge time conversion value FTC is computed using the following Expression 3.

[3]

$$\text{Full charge time conversion value FTC} = k_{temp} \times \text{Start-of-charge charge state SOCS} + \text{actual charge time measurement value TM} \quad \text{(Expression 3)}$$

In the above Expression 3, full charge time conversion value FTC can be determined by adding actual charge time measurement value TM to the length of time estimated to be required for charging from the SOC of 0% to start-of-charge charge state SOCS.

This full charge time conversion value FTC includes the most recent actual charge time measurement value TM as a component. In addition, actual charge time measurement value TM includes the charge stop time in a case where the charge is stopped during the charge processing. Thus, full charge time conversion value FTC is more accurate than full charge time estimate FTE determined by the above Expression 1 as an estimate of time required to be fully charged (charge from SOC of 0% to 100%) in the current operating environment.

Processor 22 updates full charge time reference value FTR and input voltage reference value VR in table T using full charge time conversion value FTC computed in step S207 and start-of-charge input voltage VM acquired in step S201 (step S208). For example, when the start-of-charge battery temperature is 15° C., full charge time reference value FTR "A2" and input voltage reference value VR "B2", which are associated with battery temperature "10° C. or higher and lower than 20° C." in table T, are to be updated. The updated new full charge time reference value FTR and input voltage reference value VR are used in the next and subsequent remaining charge time computations. This allows the use of correlation data learned from the most recent operating environment in the next and subsequent remaining charge time computations, thereby achieving highly accurate remaining charge time estimation.

As described above, according to the present embodiment, in control apparatus 20, processor 22 computes the remaining charge time of BBU 1 based on the linear approximation of the correlation between the operating environment of BBU 1 and the charge time of BBU 1 including the charge stop time. This enables remaining charge time estimation taking into account the charge stop time caused in the bank switch method, for example, thereby improving the accuracy of the remaining charge time estimation.

In addition, processor 22 reads the correlation data stored in advance in storage 21, computes the remaining charge time using the read correlation data, and updates the correlation data in storage 21 based on the actual charge time measurement value. This allows the use of correlation data learned from the most recent operating environment of BBU 1 in the next and subsequent remaining charge time estimations, thereby achieving sustained improvement in estimation accuracy. Further, repeating the estimation minimizes the estimation error.

Processor 22 also computes the remaining charge time using certain battery temperature-specific data corresponding to the start-of-charge battery temperature among the battery temperature-specific data set for each battery temperature reference value of BBU 1. This allows different correlation data for different battery temperatures to be reflected in the computation of remaining charge time, thereby enabling highly accurate remaining charge time estimation for any battery temperatures.

The battery temperature-specific data includes full charge time reference value FTR and input voltage reference value VR. Processor 22 acquires full charge time estimate FTE by adjusting full charge time reference value FTR based on the difference between start-of-charge input voltage VM and input voltage reference value VR, and acquires remaining charge time estimate RTE by adjusting the acquired full charge time estimate FTE based on start-of-charge charge state SOCS. This enables highly accurate remaining charge time estimation based on the known full charge time reference value FTR and input voltage reference value VR.

The correlation data includes constants k and $k_{temp}$ of the approximate expression for the correlation. Processor 22 uses constant k, which is independent of the battery temperature, for the adjustment of full charge time reference value FTR, and uses constant $k_{temp}$, which depends on the battery temperature, for the adjustment of full charge time estimate FTE. This allows the correlation between the input voltage and the full charge time, which is independent of the battery temperature, (see FIG. 7A) and the correlation between the start-of-charge SOC and the required charge time, which depends on the battery temperature, (see FIG. 7B) to be reflected in the computation of remaining charge time, thereby enabling more reliable estimation of the remaining charge time with high accuracy.

Further, processor 22 acquires full charge time conversion value FTC by converting actual charge time measurement value TM, updates full charge time reference value FTR corresponding to the start-of-charge battery temperature based on the acquired full charge time conversion value FTC, and updates input voltage reference value VR corresponding to the start-of-charge battery temperature based on the start-of-charge input voltage VM. The correlation data can be easily updated by normalizing actual charge time measurement value TM to a value (full charge time conversion value FTC) that can be easily used for the next and subsequent estimations.

Although the embodiment of the present disclosure has been described in detail, the present disclosure is not limited to the above specific embodiment and can be practiced in various forms of the specific examples described in the above embodiment within the gist or essential characteristics of the present disclosure recited in the claims.

For example, a power storage control apparatus other than control apparatus 20 may be provided outside BBU 1, and the outside power storage control apparatus may perform the remaining charge time computing method described in the above embodiment by cooperation through communication between control apparatus 20 inside BBU 1 and the power storage control apparatus outside BBU 1.

Industrial Applicability

The present disclosure is particularly useful for a control apparatus of a power storage apparatus that supplies power to a load apparatus operating by power supply from an external power source in case of a power supply emergency of the external power source.

REFERENCE SIGNS LIST

1 Battery bank unit
2 External power source
3 Load apparatus
4 Power line
10 Input/output terminal
20 Control apparatus
21 Storage
22 Processor
30 Power storage
31 First battery bank
32 Second battery bank
40 Charge/discharge circuitry
41 Boost DC/DC converter
42 Switch
42*a* First terminal
42*b* Second terminal
42*c* Third terminal
43 First charge switch
43*a* First terminal
43*b* Second terminal
44 First discharge switch
44*a* First terminal
44*b* Second terminal
45 Second charge switch
45*a* First terminal
45*b* Second terminal
46 Second discharge switch
46*a* First terminal
46*b* Second terminal
48 First constant current circuitry
49 Second constant current circuitry
61 Input/output voltage sensor
62 Input/output current sensor
63 First battery voltage sensor
64 First battery temperature sensor
65 Second battery voltage sensor
66 Second battery temperature sensor
T Table
ALa25, ALa35, ALb25, ALb35 Approximate straight line

What is claimed is:

1. A power storage control apparatus, comprising:
a storage; and
a processor configured to:
be communicatively connected to a charge/discharge circuitry of a power storage apparatus and control charging and discharging of the power storage apparatus, the power storage apparatus including a plurality of battery banks and employing a bank switch method as a charge method;
compute a remaining charge time of the power storage apparatus based on linear approximation of correlation between an operating environment of the power storage apparatus and a charge time of the power storage apparatus, the charge time including a charge stop time;

read correlation data stored in advance in the storage, compute the remaining charge time using the read correlation data, and update the correlation data in the storage based on an actual measurement value of the charge time, the correlation data including a reference value of a full charge time of the power storage apparatus and a reference value of an input voltage to the power storage apparatus from an external power source, the reference values both set for each of a plurality of reference values of a battery temperature of the power storage apparatus;

acquire a conversion value of the full charge time by converting the actual measurement value of the charge time;

update the reference value of the full charge time in the storage corresponding to a battery temperature at a start of charge based on the acquired conversion value of the full charge time; and update the reference value of the input voltage in the storage corresponding to the battery temperature at the start of charge based on the input voltage at the start of charge.

2. The power storage control apparatus according to claim 1, wherein, the processor computes the remaining charge time using the reference value of the full charge time and the reference value of the input voltage corresponding to the battery temperature at the start of charge.

3. The power storage control apparatus according to claim 2, wherein, the processor:

acquires an estimate of the full charge time by performing adjustment of the reference value of the full charge time based on a difference between the input voltage at the start of charge and the reference value of the input voltage, and acquires an estimate of the remaining charge time by performing adjustment of the acquired estimate of the full charge time based on a state of charge of the power storage apparatus at the start of charge.

4. The power storage control apparatus according to claim 3, wherein, the correlation data includes a constant of an approximate expression for the correlation, and the processor uses a constant that is independent of the battery temperature for the adjustment of the reference value of the full charge time and uses a constant that depends on the battery temperature for the adjustment of the estimate of the full charge time.

5. The power storage apparatus comprising the power storage control apparatus according to claim 1, wherein the power storage apparatus supplies power to a load apparatus in case of a power supply emergency of the external power source, the load apparatus operating by power supply from the external power source.

6. The power storage control apparatus according to claim 1, wherein the actual measurement value of the charge time is a measurement result of the charge time from the start of charge to a full charge; and the processor acquires the conversion value of the full charge time by normalizing the actual measurement value of the charge time into a value corresponding to the full charge time based on a state of charge of the power storage apparatus at the start of charge.

7. A remaining charge time computing method for computing a remaining charge time of a power storage apparatus that includes a plurality of battery banks and employs a bank switch method as a charge method, the method comprising:

controlling charging and discharging of the power storage apparatus by a processor communicatively connected to a charge/discharge circuitry of the power storage apparatus;

computing, by the processor, the remaining charge time of the power storage apparatus based on linear approximation of correlation between an operating environment of the power storage apparatus and a charge time of the power storage apparatus, the charge time including a charge stop time;

reading correlation data stored in advance in a storage, computing the remaining charge time using the read correlation data, and updating the correlation data in the storage based on an actual measurement value of the charge time, the correlation data including a reference value of a full charge time of the power storage apparatus and a reference value of an input voltage to the power storage apparatus from an external power source, the reference values both set for each of a plurality of reference values of a battery temperature of the power storage apparatus;

acquiring a conversion value of the full charge time by converting the actual measurement value of the charge time;

updating the reference value of the full charge time in the storage corresponding to a battery temperature at a start of charge based on the acquired conversion value of the full charge time; and updating the reference value of the input voltage in the storage corresponding to the battery temperature at the start of charge based on the input voltage at the start of charge.

8. A non-transitory computer-readable storage medium storing a remaining charge time computing program for causing a computer to implement the remaining charge time computing method according to claim 7.

* * * * *